United States Patent [19]

Broadie

[11] Patent Number: 5,394,472
[45] Date of Patent: Feb. 28, 1995

[54] MONAURAL TO STEREO SOUND TRANSLATION PROCESS AND APPARATUS

[75] Inventor: Richard G. Broadie, P.O. Box 615, Palm Springs, Calif. 92263

[73] Assignees: Richard G. Broadie; Sharon A. Broadie, both of Palm Springs, Calif.

[21] Appl. No.: 103,538

[22] Filed: Aug. 9, 1993

[51] Int. Cl.[6] .............................................. H03G 3/00
[52] U.S. Cl. ........................................... 381/1; 381/63
[58] Field of Search .................. 381/61, 1, 18, 27, 17, 381/63

[56] References Cited

U.S. PATENT DOCUMENTS 4,308,423  12/1981  Cohen ..................................... 381/1
5,056,149  10/1991  Broadie .................................. 381/17
5,119,420   6/1992  Kato et al. .............................. 381/1

OTHER PUBLICATIONS

Dorf, Richard C., *Modern Control Systems*, 6th Ed., Addison-Wesley Pub. Co., 1992, p. 66.

Primary Examiner—Forester W. Isen
Attorney, Agent, or Firm—Blakely, Sokoloff, Taylor & Zafman

[57] ABSTRACT

A process and apparatus are disclosed which provides increased perceptual location control and spatial characteristics to existing multi-channel material, said apparatus includes a plurality of input terminals adapted for receiving multi-channel audio input; at least one processing channel having gain control means, at least one processing channel having time delay means, which in combination, spatially enriches previously existing multi-channel material. The process for providing increased spatial characteristics to existing multi-channel material teaches operations in accordance with the apparatus.

24 Claims, 4 Drawing Sheets

MONAURAL TO STEREO SOUND TRANSLATION PROCESS AND APPARATUS

BACKGROUND OF THE INVENTION

The present invention relates to a process and an apparatus for spatially enriching previously existing multi-channel material. More specifically, the present invention relates to a circuit including a number of components such as gain controllers, phase inverters and time delays which, in combination, modify Applicant's prior issued United States Patent (U.S. Pat. No. 5,056,149) for generating a multi-channel output from a single channel input. The present invention further relates to a process for generating a multi-channel output from a single channel input in accordance with the operations of the device.

Many contingencies exist wherein there is a need to increase spatial imagery in pre-existing stereophonic signals. Typical examples include synthetic music sources such as those created in the digital realm (e.g., digital synthesizers, samplers, etc.) and current standard recording techniques (e.g., placing microphones very close to an instrument or the performer's mouth in order to capture the music therefrom). In such examples, little spatial information, if any, is included in the original multi-channel recordings (or presentation technology). However, by using phase inverted paired signals ("PIPs"), which are two signals of equal frequency, content and amplitude but 180 degrees out of phase with one another, in conjunction with multi-channel sources, an increase in perceptual width, depth and sonic transparency will occur. In some instances, sound may appear to come from positions outside a "normal" stereophonic field as provided by two speaker "stereophonic" presentation.

Moreover, it bias become increasingly desirable to spatially position certain instruments, voices and the like so that their sonic images may appear in front or behind the rest of the output by such well known means as four channel surround sound matrix playback decoding equipment. In addition to "normal" left and right speakers, this matrix presents the summed signal (A+B) via a front-center speaker and the difference signal (A−B) via a rear-center speaker. Means are herein provided to control front to back imaging ratios.

Three embodiments of the present invention incorporate the concept of a "time mixer" to control spatial imaging. By controlling the arrival time of one channel of a multi-track source material with respect to all other channels, the Haas or precedence effect will make such "time modulated" channel to appear to be in front, with, or behind other multi-track channels. When incorporating such technology in conjunction with such as PIP circuitry and balance means, the "time mix" will result in producing dramatic sonic effects which may "project" the time modulated channel to virtually any sonic position desired.

Current technologies such as digital work stations and circuitry emulation systems, well known to those skilled in the art, provide electronic circuits by Digital Signal Processing ("CDSP") means. Though computer software modifications of such DSP programs, many sets of PIPs circuits analogous to the devices of FIGS. 1, 3 and 4 may be constructed. For example, in the DSP algorithm of FIG. 3, multiple PIPs may simultaneously lead, lag or be equal in time with a stereophonic synchronized time delay. The combination of multiple PIPs, in conjunction with balance controllers, such as a balance potentiometer which interfaces the modulated signal with the stereophonic signal field, provides the user with amazing capabilities for placement of a single instrument in a stereophonic or surround sound field. Due to the large number of PIP circuitry interrelationships made possible by such DSP programming means, many such contingencies cannot reasonably be illustrated herein, but should be considered within the scope of the present invention. However, each and every embodiment of the present invention may be employed in remastering pre-existing stereophonic and/or multi-channel sound.

With ever increasing frequency, multi-track studios are being replaced with digital two-track studios. Remixing two-track master recordings is currently considered impossible by many in the field. The apparatus of FIG. 1 is specifically designed to handle such a contingency situation. By summing or otherwise extracting portions of the input stereo signal and using the portions as a signal to a "M" input of the devices illustrated in FIGS. 2, 3 and 4, effective remixes from two-track sources are also made possible.

While it is anticipated that the major area of application for the present invention is to produce the sensation of three dimensional reality in a recording or remastering situation, many other uses are anticipated. In live sound reinforcement situations, lead instruments/voices may be sonically projected into the audience by such means as time modulation in conjunction with PIP technologies, whereby perception of "loudness" of the instruments/voices may occur without employing certain sound pressure levels toward the audience.

Post production film and video houses may have means for fully utilizing existing sound effect libraries or creating entirely new ones, with the creation of spatial relationships never found in nature. In current and future technologies, such as in digital broadcasting, codes utilizing spatial parameters as provided by the present invention may be separately from digital sound (e.g., music) information whereby a three dimensional matrix may be produced at the receiver with spatial information thereby achieved with extreme efficiencies.

As is now known to be the case of Applicant's prior issued United States Patent (U.S. Pat. No. 5,056,149), many new technologies such as CD-ROM, Digital Broadcasting and Virtual Reality applications will find much benefit in employing the present invention. While the present invention focuses upon reconfiguring stereophonic source material, it should be noted that FIGS. 1, 3 and 4, in the presence of monaural input signal, may be utilized in a manner similar, if not identical, to that of my above cited patent.

FIG. 1 of the present invention differs from FIG. 3 of my above cited U.S. Patent primarily in that it provides for stereophonic input with retention of input stereo information in the output. With monaural input, FIG. 1 would function virtually identically with the FIG. 3 of the prior cited patent. In some applications such as CD-ROM computer storage systems where storage space for audio information may be limited, use of such as FIG. 1 of the present invention (or the apparatuses of my prior cited invention), an effective stereo output may be produced by storing monaural audio data in conjunction with encoded data which may "drive" the apparatus wherein a second channel of audio information may thereby be produced. A similar area of application would be in broadcasting wherein due to bandwidth considerations, it may be advantageous to broadcast a monaural signal in conjunction with encoded data which may be decoded in the receiver to produce stereophonic sound. There are also advantages to this system inasmuch as no multi-path FM interference, commonly found in today's FM transmissions, would occur. Such applications would be evident in other areas, including digital broadcasting, to those skilled in the art.

In interactive virtual reality situations, such as either entertainment centers or commercial environmental (e.g. aircraft/spaceflight) simulators, a monaural storage system could be controlled by varying algorithms of the present invention in FIG. 1 or the apparatuses of Applicant's prior cited patent whereby the user receives interactive audio feedback which corresponds with visual interactive stimulus information.

When employing stereophonic input to such virtual reality situations (the more common case), the stereophonic sonic environment can be manipulated in such interactive manner by all the apparatuses of the present invention.

In some virtual reality applications a third signal may be provided or generated in conjunction with a pre-existing stereo background signal. The apparatuses of FIGS. 3 and 4 would be especially effective in such situations inasmuch as a signal fed to the channel M input information could be made to appear in front, behind, or at any location within the pre-recorded stereophonic field. Therefore, modifications of the present invention with respect to four or more channel sonic fields would be obvious to those skilled in the art and thus, are not discussed herein.

In anticipation of interactive broadcasting, the present invention could allow monaural compatibility for non-participating viewers/listeners while providing the participant with means of total sonic interaction. Unique sonic contours may be produced by the present means whereby algorithms may be selected to optimize the sound for a given listening environment be it a home, a car, a studio, a dance club or a concert hall.

Whether in hardware or software form, many other areas of application not contained herein will be evident to those skilled in the art.

SUMMARY OF THE INVENTION

An apparatus and process are disclosed which provides increased spatial characteristics to existing multi-channel material, the device includes a plurality of input terminals primarily adapted for receiving multi-channel audio input; at least one processing channel having gain control means, at least one processing channel having time delay means, which in combination, spatially enriches previously existing multi-channel material. The process provides increased spatial characteristics as well as location control of sonic information to existing multi-channel material in accordance with the operations of the device.

These and other objects, features and advantages of the invention will be apparent from the following detailed description when used in conjunction with the; accompanying drawings.

DETAILED DESCRIPTION OF THE INVENTION

An apparatus and process are described which are useful for controlling location of sonic information as well as spatially enriching previously existing multi-channel material. In the following detailed description, numerous specific details are set forth, such as specific components. It is apparent, however, to one skilled in the art that the present invention may be practiced without incorporating the specific components.

Figure 1:
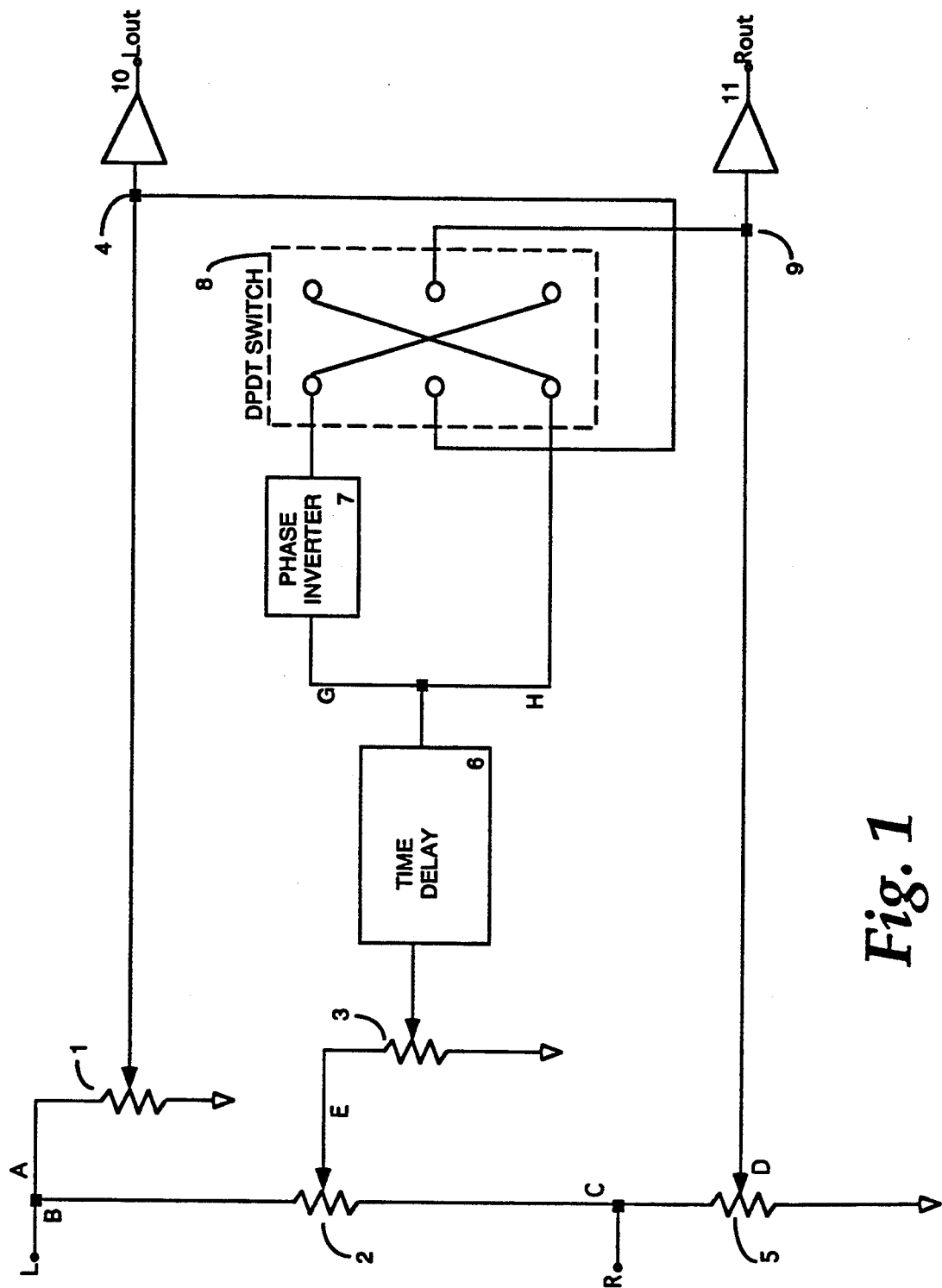
FIG. 1 is a block diagram of an embodiment of the invention which utilizes a single one-channel variable time delay, three gain controllers and one phase inverter in the production of a spatially enhanced two-channel audio output from one or two-channel audio input.

Referring to the configuration of FIG. 1, one embodiment of the present invention includes two input terminals L and R in which a stereophonic signal is inputted into the two input terminals L and R, resulting in signals L and R respectively.

After being inputted into the input terminal L, signal L is then divided into two signals, A and B. A gain controller, which includes such components as a potentiometer 1, supplies gain control to signal A. The gain controlled signal A is inputted into a mixer bus 4, which is defined as a passive junction having two or more signals electrically combined (e.g., trace connections of two or more signal lines on a printed circuit board.) Signal B is fed to a first input of a mixer potentiometer 2.

Signal R is divided into two signals, C and D, whereby a potentiometer 5 imparts gain control to signal D. The gain controlled signal D is fed to a mixer bus 9. Signal C, however, is fed to a second input of the mixer potentiometer 2.

Signal E from center tap of the mixer potentiometer 2 is imparted with gain control by a potentiometer 3 and time delay by a one-channel variable time delay 6. All such variable time delays, herein, whether they are one-channel or synchronized two-channel, are linear, high-fidelity delays via software which are well known to those skilled in the art. In such delays, output signals are virtually identical to their corresponding input signals, save consideration of selected time delay increments and, possibly, amplitudes.

Moreover, these variable time delays also do not manifest reverberative or multiple echo characteristics in the outputs. The above time delay components may be considered identical to those included in U.S. Pat. No. 5,056,149 except that delay increments of as little as 20 microseconds ("μs") are now achievable and have been found to affect imaging characteristics under certain contingency situations. It has been found that, when employing small delays in the range of 20 μs to 2 milliseconds ("ms") in conjunction with large mix values which are amplitude controlled by the potentiometer M, separation and imaging characteristics appear to be most affected. The term "mix", as used herein, refers to a ratio of PIP signals to non-PIP signals. Large delay values greater than 10 ms appear to more profoundly affect the perceptual sound stage areas. Consequently, such contingencies can fully utilize a large range of delay increments.

The gain controlled, time delayed signal E is divided into two signals G and H. Signal G is imparted with phase inversion by a phase inverter 7, and routed to either the mixer bus 4 or a mixer bus 9 by a DPDT switch 8. Such phase inverter 7, as well as all other such phase inverters in the present invention, is a component capable of inverting an output signal 180 degrees with respect to its input signal. The phase inverter is identical to those included in U.S. Pat. No. 5,056,149.

Signal H is alternatively routed to either the mixer bus 9 or the mixer bus 4 by the DPDT switch 8. In other words, the signal H is routed to the mixer bus which does not receive signal G. Phase inverted signals G and H constitute Phase Inverted Pair signals ("PIPs"). Since a phase inverted signal is fed to one of two output channels and a non-phase inverted equivalent signal is fed to a second of two output channels, the PIP information sums to zero when the output channels are recombined to mono. The total cancellation in such summation imparts perfect monaural compatibility characteristics. If delayed information without PIP cancellation characteristics are summed with non-delayed information, distortion would occur in the mono output signal. For situations in which monaural compatibility is important, PIP signals should always be equal in amplitude. Certain contingency situations may exist wherein monaural compatibility is not an important factor. In such situations, the PIP signals need not be of equal amplitude. Both contingencies are contained within the scope of this patent.

Either the phase inverted signal G or the non-phase inverted signal H is combined with gain controlled signal A at mixer bus 4 and inputted into an output amplifier 40 to form a first channel output signal Lout. Additionally, either the phase inverted signal G or the signal H, whichever signal is not combined with gain controlled signal A, is mixed with gain controlled signal D and inputted into an output amplifier 11 to form a second channel output signal Rout.

In this manner, circuitry previously described in U.S. Pat. No. 5,056,149 is modified to increase spatial transparency in pre-existing stereophonic information. Should a monaural input signal be provided to input terminals L and R, this device will perform essentially in the same manner as the apparatus of FIG. 3 of the above-indicated U.S. patent. This configuration may exist either as discrete circuitry, or as a mathematical algorithm in the software of a DSP circuitry emulation device. Currently, the present invention is utilized in a system comprising a modified Hybrid Arts Adap II with an Atari computer interface. In surround sound decoder matrix, output signals sum to perfect monaural sound for center channel, pre-existing stereo information plus that provided by PIPs circuitry provides a greatly enhanced effect. When summed to monaural sound, PIPs information is canceled, leaving mono as product of summed original stereo input information. By aforementioned DSP circuitry emulation device, additional PIP circuits as shown in the circuitry of signal E may be added.

Figure 2:
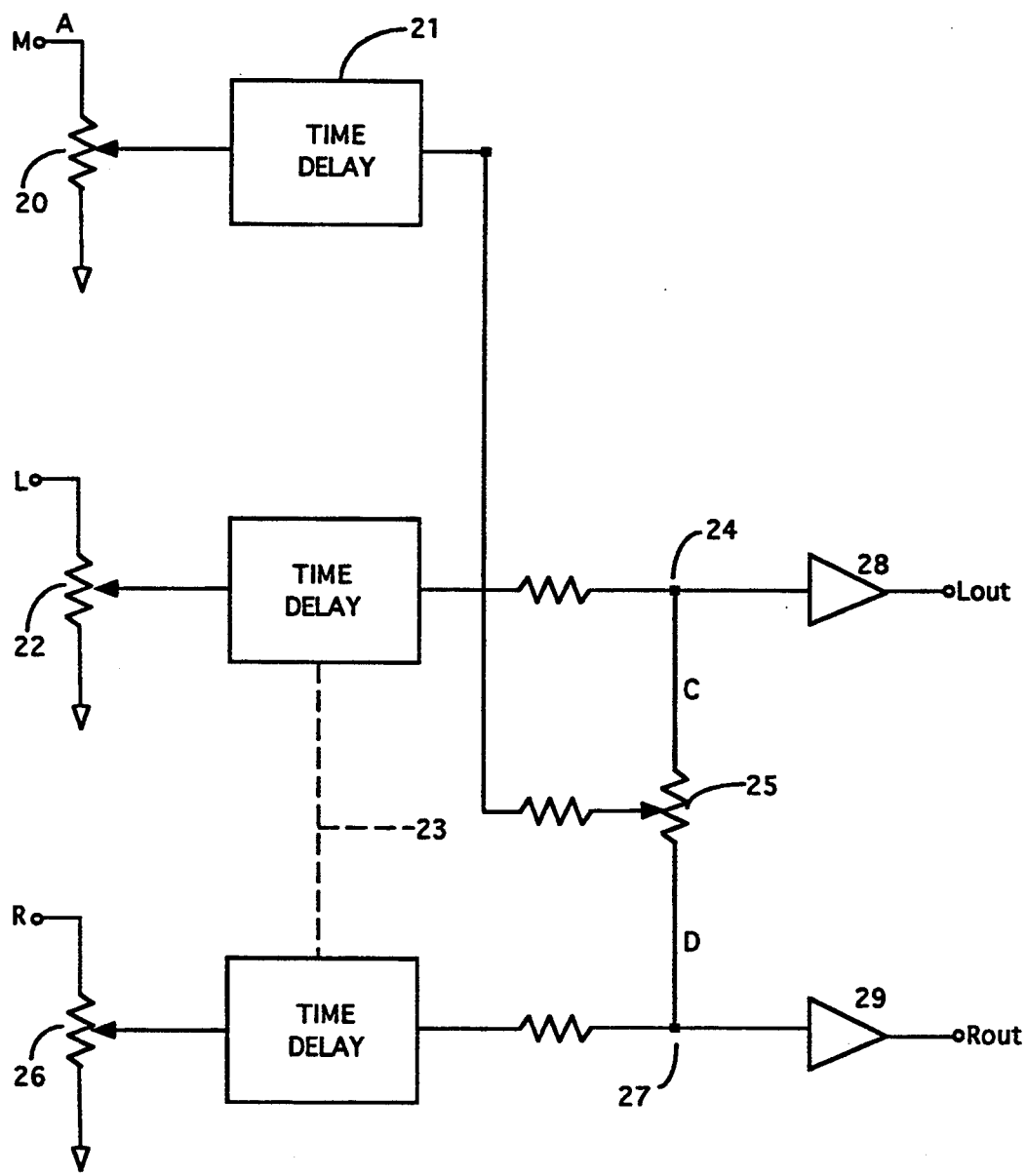
FIG. 2 is a block diagram of an embodiment of the invention which utilizes a single one-channel variable time delay, one two-channel synchronized time delay, three gain controllers and one balance controller in the production of a two-channel audio output from a multi-channel audio input.

Referring now to FIG. 2 which illustrates another embodiment of the present invention, multi-track audio information is provided as input to three terminals M, L, and R as corresponding signals M, L and R.

Signal M is gain controlled by a potentiometer 20 and inputted into a time delay 21. The gain controlled, time delayed signal M is then inputted to center tap of a balance controller, such as a balance potentiometer 25, to form a signal C and a signal D. The signal C is inputted into a mixer bus 24 while the signal D is inputted into a mixer bus 27. These signals C and D may be equal or inversely proportional in amplitude to one another.

Signal L is gain controlled by a potentiometer 22 and imparted with time delay by a first channel of a two-channel synchronized time delay 23 and is thereafter inputted into the mixer bus 24.

Signal R is gain controlled by a potentiometer 26 and imparted with time delay by a second channel of the two-channel synchronized time delay 23, and is thereafter, inputted into the mixer bus 27.

Signal C from the balance potentiometer 25 is combined with the gain controlled, time delayed signal L at the mixer bus 24 to form a first channel output signal Lout. The first channel output signal is inputted into an output amplifier 28 from which the amplified Lout signal is outputted.

Signal D from the balance potentiometer 25 is combined with the gain controlled, time delayed signal R at mixer bus 27 so as to form a second channel output signal Rout. The second channel output signal is thereafter inputted into an output amplifier 29 from which the amplified Lout signal is outputted.

The two-channel synchronized time delay equally applies time delay to each of the gain controlled input signals L and R, thereby providing continuous time synchronization between these two signals, irrespective of the time delay values selected.

In audio recording, it may be desirable to sonically project images of a solo instrument or a group of instruments in front of (or behind) the rest of the sonic field. The device disclosed in FIG. 2, also herein referred to as a "Time Mixer", allows for such a contingency. For example, in a multi-track situation, during the mix, a trumpet isolated on one recording track can be inputted into the input terminal M. The balance of remaining tracks can be mixed down stereophonically in the usual well known manner and inputted into the terminals L and R. By having one-channel variable delay 21 set to 0 microseconds and two-channel synchronized delay 23 set to 5 milliseconds, the trumpet will reach the listener 5 milliseconds before the rest of the instruments. Due to the well known Haas or precedence effect, this should sonically project the trumpet into the foreground, well in front of the stereophonic field. Should time delay relationships of delay 21 and 23 be reversed, the trumpet should sonically appear behind the rest of the stereophonic field. In summary, by controlling the time delay values of the one-channel variable time delay 21 with respect to the two-channel synchronized time delay 23, the arrival time of the trumpet can be made to either lead or lag that of the stereophonic mix, thereby the trumpet can be perceived by a listener to either be in front or behind the other instruments in accordance with it's relative arrival time to the listener.

Moreover, the balance potentiometer 25 enables the sound of the trumpet to be perceived by the listener as coming from a direction to the left or right of him. Amplitude values of the trumpet are controlled by the potentiometer 20. By controlling relative time and amplitude values, the trumpet can be located or panned anywhere the listener desires, within the stereophonic field. While the device of FIG. 2 may be quite useful in controlling perceived location via this simple "time mix" concept, it is found that most dramatic results will occur when the "time mix" concept of FIG. 2 is combined with the PIP concept of FIG. 1, as is the case in FIGS. 3 and 4.

Figure 3:
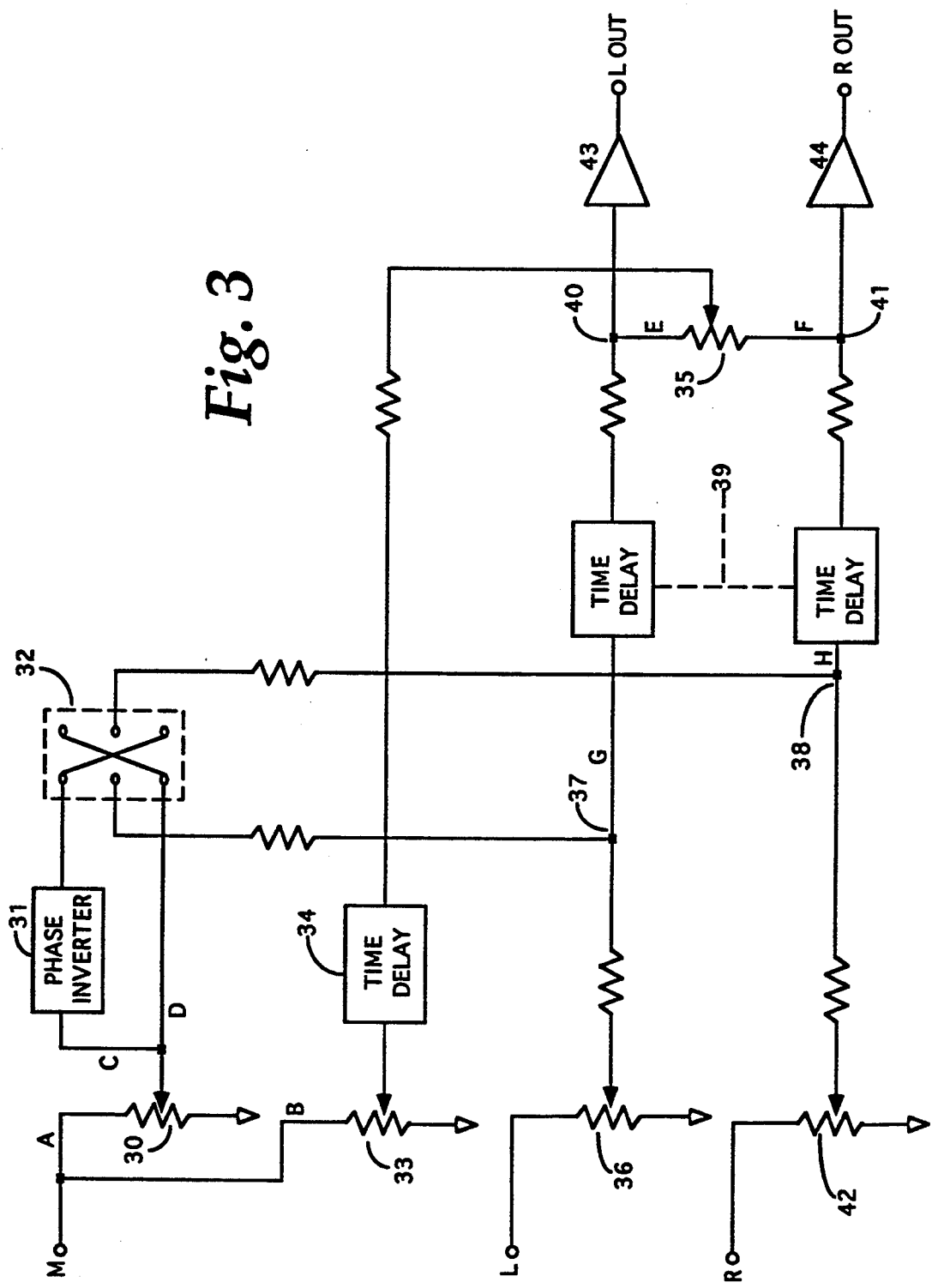
FIG. 3 is a block diagram of an embodiment of the invention which utilizes a single one-channel variable time delay, one two-channel synchronized time delay, four gain controllers, one phase inverter and one balance controller in the production of a two-channel audio output from a multi-channel audio input.

Referring now to the configuration of FIG. 3, multi-track audio information is provided as input to three terminals as signals M, L, and R.

The input signal M is divided into signals A and B. A potentiometer 30 imparts gain control upon signal A which is further divided into signals C and D. Signal C is imparted with 180° phase inversion by phase inverter 31 and is routed to either a mixer bus 37 or a mixer bus 38 by a DPDT switch 32. Signal D is alternatively routed to either a mixer bus 38 or a mixer bus 37 (i.e., in the mixer bus did not receive the phase inverted signal C) by the DPDT switch 32 Signal B is gain controlled by a potentiometer 33 and imparted with time delay by a one-channel variable time delay 34. Thereafter, the gain controlled, time delayed signal B is inputted to center tap of a balance potentiometer 35 to form a signal E and a signal F. The signal E is inputted into a mixer bus 40 while the signal F is inputted into a mixer bus 41. These signals E and F may be equal or inversely proportional in amplitude to one another.

Signal L is gain controlled by a potentiometer 36 and mixed with the phase inverted signal C at the mixer bus 37, or alternatively with signal D if the signal C is routed to the mixer bus 38, to form a signal G. The signal G is imparted with time delay by a two-channel synchronized time delay 39 and is then inputted into the mixer bus 40.

Signal R is gain controlled by a potentiometer 42 and is mixed with signal D at a mixer bus 38, or alternatively the phase inverted with signal C, to form a signal H. Signal H is imparted with time delay by the two-channel synchronized time delay 39 and then, is inputted into the mixer bus 41.

Signal E from the balance potentiometer 35 is combined with the time delayed signal G at the mixer bus 28 resulting in a first channel output signal Lout. The first channel output signal is inputted into an output amplifier 43, which amplifies and outputs the signal Lout.

Signal F from the balance potentiometer 35 is combined with the time delayed signal H at the mixer bus 41 resulting in a second channel output signal Rout. The second channel output signal is then inputted into an output amplifier 44, which amplifies and outputs the signal Rout.

Similar to FIG. 2, the two-channel synchronized time delay 39 applies time delay equally to each of the signals G and H, thereby providing continuous time synchronization between the two signals, irrespective of time delay values selected.

As previously discussed relative to FIG. 2, it may be desirable to sonically project images of a solo instrument or a group of instruments in front of (or behind) the rest of the sonic field. The device illustrated in FIG. 3 combines aspects of FIG. 1 with aspects of FIG. 2. The PIP signals, (analogous to FIG. 1), as output from DPDT switch 32 to the mixer busses 37 and 38, are combined with gain controlled input signals L and R as input to the two-channel synchronized time delay 39 (analogous to FIG. 2), thereby causing equal time delay values to be imparted upon PIP signals and gain controlled L and R signals.

When gain controlled, signal B is delayed to a lessor extent by the one-channel variable time delay 34 than output signals of the two-channel synchronized time delay 39, the signal B will appear to be placed in front of the rest of the stereophonic output field of this embodiment in accordance with the well-known principles of Haas or precedence effect. If the one-channel time delay 34 applies a greater time delay than the two-channel time delay 39, the gain controlled signal B will appear to be placed behind the rest of the stereophonic output field.

Consider the resulting signals from input signal M. Should the one-channel variable time delay 34 be set at 0 microseconds, and two channel variable time delay 39 be set at 5 milliseconds, two PIP signals C and D (which originate from signal M and are synchronously combined with input stereophonic signals L and R) would lag signal E, also originating from signal M by 5 milliseconds. In this manner, the PIP signals C and D (which are derived from input signal M) are delayed by 5 milliseconds with respect to signal B (which is also derived from input signal M). Accordingly, signal E not only leads input signals L and R by 5 milliseconds, but also leads its delayed PIP images by the same time increment. In this manner, the output of signal M not only leads the products of delayed signal L and R in the manner of FIG. 2, the signal M also leads the PIP signal in the manner of FIG. 1. The reinforcement of signal E by its own PIP image as well as by leading the rest of the stereophonic field by 5 milliseconds, provides profound ability to project the signal E in front of the rest of the stereophonic field.

By reversing the time values assigned to one-channel variable time delay 34 with a two channel variable time delay 39, signal E can be placed behind the rest of the stereophonic field. Should this "reversibility" feature not be desired, the one-channel variable time delay 34 could be eliminated, thereby denying signal E a capacity to lag the PIP signals and the L and R signals with respect to time. Elimination of the variable time delay 34 could result in cost savings as well as simplifying circuit operation.

By utilizing balance parameter 35 in conjunction with amplitude relationships as established by potentiometer 30, 33, 36 and 42, in combination with timing modification via the one-channel variable time delay 34 and the two channel variable, time delay 39, unheard of levels of presence and reality may be attained by this "three dimensional time mixing" configuration.

Figure 4:
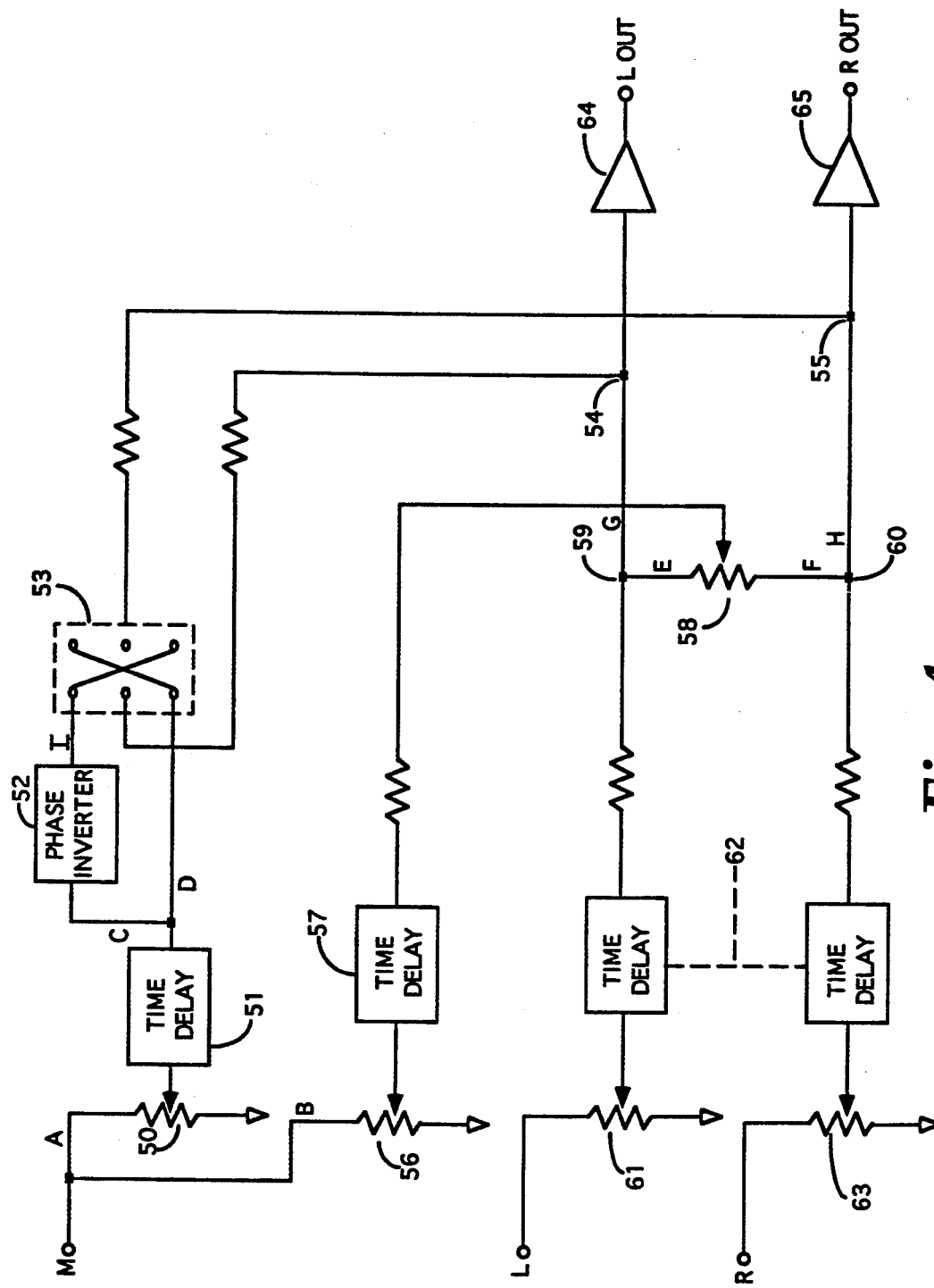
FIG. 4 is a block diagram of an embodiment of the invention which utilizes a single one-channel time delay, a two-channel synchronized time delay, four gain controllers, one phase inverter and one balance controller in the production of a two-channel audio output from a multi-channel audio input.

The configuration of FIG. 4 is identical to that of FIG. 3, except that it includes an additional one-channel variable time delay 51 which provides the PIP circuitry with time delay values which are independent relative to a two-channel synchronous time delay 62. Note that the mixer busses 54 and 55 are relocated so that a pair of output signals from a DPDT switch 53 mixes with a corresponding pair of output signals from the two-channel synchronous time delay 62 as illustrated in FIG. 4.

Output lateral positioning of sonic information of input signal M is controlled by potentiometer 58. By the addition of time delay 51, PIP signals may be made to either lead or lag or be equal to output signals of time delays 57 and 62. It has been determined that if the delay value of the single channel time delay 51 is greater than that of the dual channel time delay 62, the sonic information of input signal M can be imparted an increase of perceptual width. It has also been determined that if the delay value of time delay 51 is smaller than that of time delay 57, the sonic information of input signal M can be imparted an increase of perceptual depth. By employing two or more such PIP circuits and independent, single channel time delays in conjunction of the circuitry of input signal M, sonic information can be simultaneously imparted with increased perceptual properties of depth and width and can be "projected" in front of or behind or anywhere within the stereophonic field as provided by the output signals of synchronous time delay 62.

By employing well known Digital Signal Processing (DSP) technologies, two or more independent PIPs, as discussed in the above paragraph (and were present in the previously cited patent) have been utilized in conjunction with the embodiments of FIGS. 1, 3 and 4 of the present invention. By varying amplitude (mix) and delay values of one or more such PIP circuits, unique means are provided to control location and spatial content in the output of the embodiments. When utilized in conjunction with the balance potentiometer, elements 35 and 58 of FIGS. 3 and 4, respectively, panning anywhere in or around the sonic field becomes possible. Due to the immense number of possibilities now available through DSP components, all such contingencies cannot be herein included in terms of analogous circuitry, but should be considered within the scope of the present invention.

All of the above figures may be employed in remastering pre-existing stereophonic sound. With ever increasing frequency, multi-track studios are being replaced with digital two-track studios. While multi-track studios provide engineers with numerous "mix-down" options whereby controlling such variables as equalization, amplitude and pans are readily available on each channel, no such "fix it in the mix" (a bad option, at best) is possible with digital two-track studios. By utilizing the L, R or combination, in any ratio thereof as input signal M of the devices of FIGS. 1, 2, 3 and 4, many unique and effective "re-mix" options become available.

General operating parameters recommended are as follows: Time delay and amplitude values should be selected to meet needs of user. In some musical applications, 5 milliseconds delay sound exaggerated and gimmicky while, in the case of some special effects applications, 40 milliseconds delay may not provide significantly dramatic results. In the present invention 20 microsecond delay increments are made available to the user along with a maximum delay value of 80 milliseconds. Wherein if the user wants to avoid using an exaggerated sound, the amplitude of PIP should be inversely proportional to the time delay value.

Wherein monaural compatibility is significant, the ratio of PIP signal amplitude to total output signal amplitude should be minimized whereby unacceptably low signals do not result during signal summation. For broadcast applications, it is recommended that total PIP signal amplitude (mix) not exceed 30% of the total output signal.

The above embodiments are compatible with current surround sound technology, in which the stereo output signals, Lout and Rout, are conventionally referred to as signals A and B respectively wherein the A+B front center signal is mono, the A and B channels separate to left and right and an A−B signal is presented behind the listener as ambiguous stimulus information.

The embodiments of FIGS. 1, 3, and 4, which employ aforementioned PIP circuitry, may control front to back ratios in current surround sound technologies whereby the A+B front center signal is mono, the A and B channels separate to left and right and the A−B signal is presented behind the listener as ambiguous stimulus information. In such surround sound situations, front to back displacement is determined by the ratio of PIP signal to total output signal. When summed to mono, as A+B to the front center speaker, amplitude of a PIP signal is equal to zero (An+(−Bn)=0) irrespective of PIP amplitude. However, difference signals are considered, as A−B to the rear speaker, amplitude output (+An−(−Bn)=2n) is increased in proportion to amplitude of PIP signal because the PIP signal B is doubly inverted. Therefore, changing the amplitude of PIP signals may be used as means to control front to back location imaging.

In FIGS. 2, 3 and 4 of the present invention, balance potentiometer exist whereby in-phase signals may be presented to either or both channels. In normal operation, balance potentiometer usually provide approximately equal signal to both channels. In the above cited A−B matrix, wherein the A channel is made to be 180 degrees out of phase with the B channel, complete cancellation of this signal will only occur if signals are of equal amplitude. By panning the balance potentiometer to the left or right from center, the amplitude of these signals would not be equal. Accordingly, the difference signal would be increased, thereby providing a means to pan from front to back as well as to left or right from center.

While the present invention provides its user with a number of DSP controlled presets, such user is capable of experimenting to explore the full range of parameters made available to him by the means of the present invention. However, time and amplitude limitations do exist as herein above described.

The present invention, herein described, may be designed in many different methods and many different components. For example, specific time delays may be considered removed from a illustrated device whenever such time delays is set to zero. While the present invention has been described in terms of various embodiments, other embodiments may come to mind to those skilled in the art without departing from the spirit and scope of the present invention. The invention should, therefore, be measured in terms of the claims which follow.

What we claim is:

1. A device for producing improved spatial imaging from a two-channel audio input source whereby a first stereophonic input signal L input into a first terminal of the device and a second stereophonic input signal R is input into a second terminal of the device comprising:
   means for dividing said first stereophonic input signal L into signals A and B;
   means for dividing said second stereophonic input signal R into signals C and D;
   means for providing gain control to said signal A;
   means for providing gain control to said signal D;
   means for mixing said signal C with said signal B so as to form an output signal E;

means for providing gain control to said output signal E;

means for imparting time delay to said gain controlled signal E;

means for dividing said gain controlled, time delayed signal E into two signals G and H;

means for inverting said signal G by approximately 180 degrees with respect to said signal H;

means for switching said phase inverted signal G and said signal H, said switching means mixing said phase inverted signal G with said signal A to produce a first channel output signal and said signal H with said signal D to produce a second channel output signal if a first position of said switching means is selected and said switching means mixing said phase inverted signal G with said signal D to produce said first channel output signal and said signal H with said signal A to produce said second channel output signal if a second position of said switching means is selected.

2. The device according to claim 1, wherein said signals G and H are equal in amplitude.

3. The device according to claim 1, wherein said device further comprises means for amplifying said first channel output signal and said second channel output signal.

4. A device for imparting time differentials to an independent audio input signal M in conjunction with multi-track audio input signals L and R, said device comprising:

means for providing gain control to said signal M;

means for imparting time delay to said signal M;

means for dividing gain controlled, time delayed signal M into a signal C and a signal D;

means for providing gain control to said signal L;

means for providing gain control to said signal R;

means for imparting time delay to signal L;

means for imparting time delay to signal R;

means for mixing said signal C with gain controlled, time delayed signal L so as to provide a first channel output signal; and means for mixing said signal D with gain controlled, time delayed signal R so as to provide a second channel output signal;

whereby said independent audio input signal M may be made to lead or lag, in time, with respect to audio input signals L and R, which are synchronized, with respect to time.

5. The device according to claim 4, wherein said dividing means produces said signal C having an amplitude equal to an amplitude of said signal D.

6. The device according to claim 4, wherein said dividing means produces said signal C having an amplitude inversely proportional to an amplitude of said signal D.

7. The device according to claim 4, wherein said device further comprises means for amplifying said first channel output signal and said second channel output signal.

8. A device for imparting time differentials to an independent signal M in conjunction with stereophonic signals L and R, said device comprising:

means for dividing said input signal M into a signal A and a signal B;

means for providing gain control to said signal A;

means for dividing said gain controlled signal A into a signal C and a signal D;

means for inverting said signal C by approximately 180 degrees with respect to said signal D;

means for providing gain control to said signal B;

means for imparting time delay to said gain controlled signal B;

means for dividing said gain controlled, time delayed signal B into a signal E and a signal F;

means for providing gain control to said signal L;

means for providing gain control to said signal R;

means for switching said phase inverted signal C and said signal D, said switching means mixing said phase inverted signal C and said signal R to produce a signal H and said gain controlled signal L with said signal D to produce a signal G if a first position of said switching means is selected and said switching means mixing said signal D with said signal R and said phase inverted signal C with said gain controlled signal L to produce a signal G if a second position of said switching means is selected;

means for imparting time delay to said signal G;

means for imparting time delay to said signal H;

means of mixing said time delayed signal G with said signal E in order to produce a first channel output signal; and means of mixing said time delayed signal H with said signal F in order to produce a second channel output signal.

9. The device according to claim 8, wherein said means for dividing said gain controlled, time delayed signal B produces said signal E having an amplitude equal to an amplitude of said signal F.

10. The device according to claim 8, wherein said means for dividing said gain controlled, time delayed signal B produces said signal E having an amplitude inversely proportional to an amplitude of said signal F.

11. The device according to claim 8, wherein said signals G and H are synchronized with respect to time.

12. The device according to claim 8, wherein said device further comprises means for amplifying said first channel output signal and said second channel output signal.

13. A device for imparting time differentials to an independent signal M in conjunction with stereophonic signals L and R in which said independent signal M is divided into two signals, a signal A and a signal B, said device comprising:

means for providing gain control to said signal A;

means for imparting time delay to said gain controlled signal A;

means for dividing said gain controlled, time delayed signal A into a signals C and a signal D;

means for inverting said signal C by approximately 180 degrees with respect to said signal D;

means for switching said phase inverted signal C and said signal D;

means for providing gain control to said signal B;

means for imparting time delay to said gain controlled signal B;

means for dividing said gain controlled, time delayed signal B into a signal E and a signal F;

means for providing gain control to signal L;

means for providing gain control of signal R;

means for providing synchronized time delay to both said gain controlled signal L and said gain controlled signal R, said synchronized time delay means receives as input said gain controlled signals L and R and synchronously outputs a first and second channel output;

means for mixing said first channel output of said synchronized time delay means with said signal E in order to form a signal G;

means for mixing said second channel output of said synchronized time delay means with said signal F in order to form a signal H; and means for switching said phase inverted signal C and said signal D, said switching means mixing said phase inverted signal C with said signal G to produce a first channel output signal and said signal H with said signal D to produce a second channel output signal if a first position of said switching means is selected and said switching means mixing said phase inverted signal G with said signal D to produce said first channel output signal and said signal H with said phase inverted signal C to produce said second channel output signal if a second position of said switching means is selected.

14. The device according to claim 13, wherein said device further comprises means for amplifying said first channel output signal and said second channel output signal.

15. The device according to claim 13, wherein said means for dividing said gain controlled, time delayed signal B produces said signal E having an amplitude equal to an amplitude of said signal F.

16. The device according to claim 13, wherein said means for dividing said gain controlled, time delayed signal B produces said signal E having an amplitude inversely proportional to an amplitude of said signal F.

17. A process for producing improved spatial imaging from a two-channel audio input source, a first stereophonic input signal L input into a first terminal and a second stereophonic input signal R input into a second terminal, said process comprising the steps of:

dividing said first stereophonic input signal L into signals A and B;

dividing said second stereophonic input signal R into signals C and D;

providing gain control to said signal A;

providing gain control to said signal D;

mixing said signal C with said signal B so as to form an output signal E;

providing gain control to said output signal E;

imparting time delay to said gain controlled signal E;

dividing said gain controlled, time delayed signal E into two signals G and H;

inverting said signal G by approximately 180 degrees with respect to said signal H;

mixing said phase inverted signal G with said gain controlled signal A to produce a first channel output signal and said signal H with said gain controlled signal D to produce a second channel output signal if a first position of said switching means is selected and alternatively, said switching means mixing said phase inverted signal G with said gain controlled signal D to produce said first channel output signal and said signal H with said gain controlled signal A to produce said second channel output signal if a second position of said switching means is selected.

18. The process according to claim 17, wherein said process further includes a step of amplifying said first channel output signal and said second channel output signal.

19. A process for imparting time differentials to an independent audio input signal M in conjunction with multi-track audio input signals L and R, said process comprising the steps of:

providing gain control to said signal M;

imparting time delay to said signal M;

dividing gain controlled, time delayed signal M into a signal C and a signal D;

providing gain control to said signal L;

providing gain control to said signal R;

imparting time delay to said signal L;

imparting time delay to said signal R;

mixing said signal C with gain controlled, time delayed signal L so as to provide a first channel output signal; and mixing said signal D with gain controlled, time delayed signal R so as to provide a second channel output signal.

20. The process according to claim 19, wherein said process further includes a step of amplifying said first channel output signal and said second channel output signal.

21. A process for imparting time differentials to an independent signal M in conjunction with stereophonic signals L and R, said process comprising the steps of:

dividing said input signal M into a signal A and a signal B;

providing gain control to said signal A;

dividing said gain controlled signal A into a signal C and a signal D;

inverting said signal C by approximately 180 degrees with respect to said signal D;

imparting gain control to said signal B;

imparting time delay to said gain controlled signal B;

dividing said gain controlled, time delayed signal B into a signal E and a signal F;

providing gain control to said signal L;

providing gain control to said signal R;

mixing said phase inverted signal C and said signal R to produce a mixed signal H and said gain controlled signal L with said signal D to produce a mixed signal G if a first position of said switching means is selected and alternatively, said switching means mixing said signal D with said signal R to produce said mixed signal H and said phase inverted signal C with said gain controlled signal L to produce said mixed signal G if a second position of said switching means is selected;

imparting time delay to said mixed signal G;

imparting time delay to said mixed signal H;

mixing said time delayed mixed signal G with said signal E so as to form a first channel output signal; and mixing said time delayed mixed signal H with said signal F so as to form a second channel output signal.

22. The process according to claim 21, wherein said process further includes a step of amplifying said first channel output signal and said second channel output signal.

23. A process for imparting time differentials to a plurality of multi-channel signals M, L and R in which said signal M is divided into two signals, a signal A and a signal B, said process comprising the steps of:

providing gain control to said signal A;

imparting time delay to said gain controlled signal A;

dividing said gain controlled, time delayed signal A into a signals C and a signal D;

inverting said signal C by 180 degrees with respect to said signal D;

providing gain control to said signal B;

imparting time delay to said gain controlled signal B;

dividing said gain controlled, time delayed signal B into a signal E and a signal F;

providing gain control to signal L;

providing gain control of signal R;

providing synchronized time delay to both said gain controlled signal L and said gain controlled signal R;

mixing said gain controlled, time delayed signal L with said signal E in order to form a signal G;

mixing said gain controlled, time delayed signal R with said signal F in order to form a signal H;

mixing said signal G with one of said phase inverted signal C and said signal D so as to form a first channel output signal; and mixing said signal H with one of said phase inverted signal D and said signal C so as to form a second channel output signal.

24. The process according to claim 23, wherein said process further includes a step of amplifying said first channel output signal and said second channel output signal.

* * * * *

UNITED STATES PATENT AND TRADEMARK OFFICE
CERTIFICATE OF CORRECTION

PATENT NO. : 5,394,472
DATED : February 28, 1995
INVENTOR(S) : Broadie

It is certified that error appears in the above-indentified patent and that said Letters Patent is hereby corrected as shown below:

In column 1 at line 37 "bias" should be --has--

In column 1 at line 62 "("CDSP") should be --("DSP")--

In column 8 at line 53 "variable," should be --variable--.

Signed and Sealed this

Twenty-seventh Day of June, 1995

Attest:

BRUCE LEHMAN

*Attesting Officer*       *Commissioner of Patents and Trademarks*